(12) United States Patent
Park et al.

(10) Patent No.: US 10,116,305 B2
(45) Date of Patent: Oct. 30, 2018

(54) SEMICONDUCTOR DEVICE FOR DISPLAY DRIVER IC STRUCTURE

(71) Applicant: Magnachip Semiconductor, Ltd., Cheongju-si (KR)

(72) Inventors: Jeong Hyeon Park, Daejeon (KR); Bo Seok Oh, Cheongju-si (KR); Hee Hwan Ji, Daejeon (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/392,637

(22) Filed: Dec. 28, 2016

(65) Prior Publication Data

US 2018/0013421 A1  Jan. 11, 2018

(30) Foreign Application Priority Data

Jul. 11, 2016  (KR) ........................ 10-2016-0087489

(51) Int. Cl.
*H01L 29/78* (2006.01)
*H03K 17/687* (2006.01)
(Continued)

(52) U.S. Cl.
CPC ....... *H03K 17/6871* (2013.01); *G09G 3/3688* (2013.01); *G11C 19/28* (2013.01);
(Continued)

(58) Field of Classification Search
CPC .......... H01L 29/7835; H01L 29/41775; H01L 27/088; H03K 17/6871
See application file for complete search history.

(56) References Cited

U.S. PATENT DOCUMENTS 5,300,802 A * 4/1994 Komori ................. H01L 27/105
  257/315
8,093,874 B1 * 1/2012 Huard ................. H02M 3/1582
  323/259

(Continued)

FOREIGN PATENT DOCUMENTS

KR    10-0553706 B1   2/2006
KR    10-2014-0019913 A   2/2014
(Continued)

OTHER PUBLICATIONS

Korean Office Action dated Jun. 19, 2017 in corresponding Korean Patent Application No. 10-2016-0087489 (6 pages in Korean).

*Primary Examiner* — Nathan W Ha
(74) *Attorney, Agent, or Firm* — NSIP Law

(57) ABSTRACT

A semiconductor device includes a first transistor, a second transistor, and a third transistor. The first transistor includes a first gate insulator, a first source region and a first drain region, a pair of lightly doped drain (LDD) regions that are each shallower than the first source region and the first drain region, and a first gate electrode. The second transistor includes a second gate insulator, a second source region and a second drain region, a pair of drift regions that encompass the second source region and the second drain region respectively, and a second gate electrode, and the third transistor comprises a third gate insulator, a third source region and a third drain region, and a pair of drift regions that encompass the third source and the third drain regions respectively, and a third gate electrode. The second gate insulator is thinner than the other gate insulators.

20 Claims, 11 Drawing Sheets

(51) Int. Cl.
*G09G 3/36* (2006.01)
*G11C 19/28* (2006.01)
*H01L 27/088* (2006.01)
*H01L 29/417* (2006.01)
*H03K 19/0175* (2006.01)

(52) U.S. Cl.
CPC ...... *H01L 27/088* (2013.01); *H01L 29/41775* (2013.01); *H01L 29/7835* (2013.01); *H03K 19/017509* (2013.01); *G09G 2300/0408* (2013.01); *G09G 2300/0828* (2013.01); *G09G 2300/0838* (2013.01); *G09G 2300/0871* (2013.01); *G09G 2310/0291* (2013.01)

(56) References Cited

U.S. PATENT DOCUMENTS

| | | |
|---|---|---|
| 8,269,281 B2 | 9/2012 | Park |
| 2003/0022434 A1* | 1/2003 | Taniguchi ....... H01L 21/823418 438/240 |
| 2006/0138584 A1* | 6/2006 | Ko .................... H01L 21/76202 257/500 |
| 2007/0132033 A1* | 6/2007 | Wu ................. H01L 21/823814 257/371 |
| 2009/0134467 A1* | 5/2009 | Ishida ............. H01L 21/26506 257/368 |
| 2010/0001342 A1* | 1/2010 | Furuhata ......... H01L 21/823814 257/338 |
| 2011/0042756 A1* | 2/2011 | Hikida ............ H01L 21/823418 257/392 |
| 2011/0198692 A1* | 8/2011 | Chang ................. H01L 29/0634 257/339 |
| 2011/0248342 A1* | 10/2011 | Kim ................ H01L 21/823412 257/337 |
| 2011/0303977 A1* | 12/2011 | Huang ................ H01L 21/8249 257/339 |
| 2012/0112277 A1* | 5/2012 | Denison .......... H01L 21/823814 257/337 |
| 2014/0119099 A1* | 5/2014 | Clark .................... G11C 5/146 365/149 |

FOREIGN PATENT DOCUMENTS

| | | |
|---|---|---|
| KR | 10-1467703 B1 | 12/2014 |
| KR | 10-2015-0055658 A | 5/2015 |

* cited by examiner

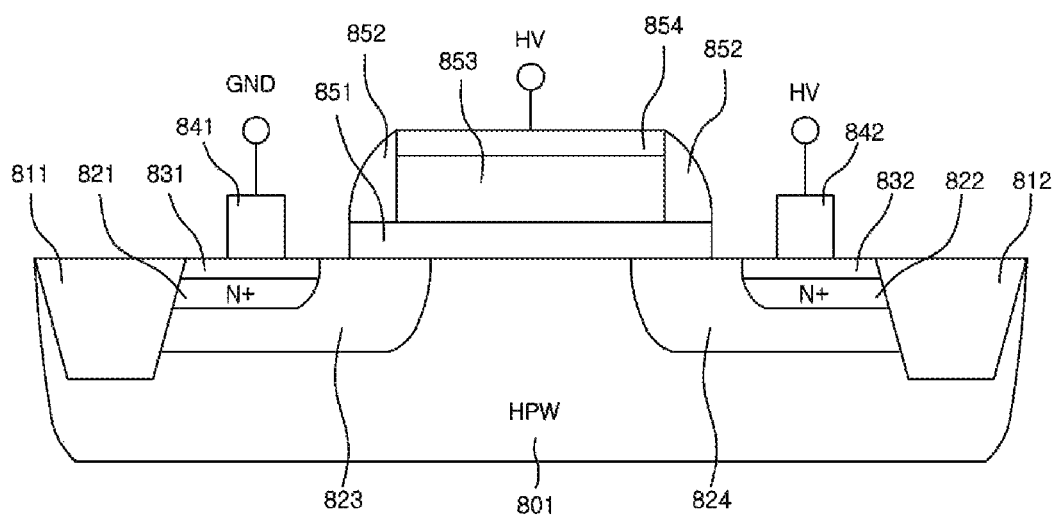

SEMICONDUCTOR DEVICE FOR DISPLAY DRIVER IC STRUCTURE

CROSS-REFERENCE TO RELATED APPLICATIONS

This application claims the benefit under 35 USC 119(a) of Korean Patent Application No. 10-2016-0087489 filed on Jul. 11, 2016 in the Korean Intellectual Property Office, the entire disclosure of which is incorporated herein by reference for all purposes.

BACKGROUND

1. Field

The following description relates to a semiconductor device. The following description also relates to a display driver IC structure that reduces the chip size by using transistors suitable for voltage used for each circuit on the display driver circuit. For instance, the transistors may be suitable for high-voltage or half voltage usage.

2. Description of Related Art

In Thin-Film Transistor Liquid-Crystal Display (TFT-LCD) technology, a column driver is also called a source driver in the sense that it runs a source electrode of TFTs used in the display. For example, when a gate driver enters into an on-status by applying a pulse onto a TFT, the source driver assumes the role of applying a signal voltage onto a pixel through a signal line. Conventionally, an analog driver that directly applies the signal voltage of the analog video onto a display was generally used. However, more recently, a digital driver is often used to apply the signal voltage. Therefore, a source driver IC receives an image data signal and a control signal digitally through an intra-panel interface from a timing controller, generates suitable analog signals, and allows a user to watch generated images on the TFT LCD panel. As the panel requires high definition, slimness, and low power features, a corresponding driver IC requires a slim form factor while also having more channels and a speedy transmission rate.

A conventional Liquid Crystal Display (LCD) source driver IC implements a chip by producing a transistor with two kinds of voltages. The conventional LCD source driver IC uses the method of dual-gate oxidation for implementation. Dual-gate oxidation is used for the purpose of implementing a transistor with two kinds of voltages, specifically, high voltage and low voltage.

In such an example, hundreds and thousands of channels are formed for the purpose of driving a TV LCD display. In such a display, about 70% of the unit channel is composed of high voltage transistor components. Accordingly, the size of the unit high voltage transistor used is significant. In a case of a high voltage transistor, the thickness of a gate insulation layer or Thick Cox increases and the size of transistor increases in order to satisfy the breakdown voltage requirements of a device, compared to a low voltage transistor. Furthermore, in an example of a high voltage transistor, the presence of a low-concentration drift region to endure a high voltage is required to be increased. Therefore, the size of a high voltage transistor increases and the chip size greatly increases as well.

Thus, when a high voltage transistor, the size of which is larger compared with a low voltage transistor, is used for the manufacturing of the LCD source driver IC, a restriction in reducing the overall size of chip is great.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a first transistor, a second transistor, and a third transistor formed on a semiconductor substrate, wherein the first transistor includes a first gate insulator having a first thickness, a first source region and a first drain region, a pair of lightly doped drain (LDD) regions that are each shallower than the first source region and the first drain region, and a first gate electrode, the second transistor includes a second gate insulator having a second thickness that is thinner than the first thickness, a second source region and a second drain region, a pair of drift regions that encompass the second source region and the second drain region respectively, and a second gate electrode, and the third transistor includes a third gate insulator having the first thickness, a third source region and a third drain region, and a pair of drift regions that encompass the third source region and the third drain region respectively, and a third gate electrode.

Lengths of the first and the second gate electrodes may each be shorter than a length of the third gate electrode.

The semiconductor device may further include an Extended Drain Metal Oxide Semiconductor (EDMOS) transistor located on the semiconductor substrate, wherein the EDMOS transistor includes an EDMOS gate insulator and an EDMOS gate electrode, an EDMOS source region and an EDMOS drain region, an EDMOS well region of a first conductivity type that encompasses the EDMOS source region, and an EDMOS drift region of a second conductivity type that encompasses the EDMOS drain region.

The EDMOS gate insulator may form a thin gate insulator and a thick gate insulator in a stepped shape, and the EDMOS drift region may extend from the EDMOS drain region to the thin gate insulator.

A depth of the EDMOS well region of the first conductivity type may be deeper than a depth of the EDMOS drift region of the second conductivity type.

The second source and second drain region of the second transistor may be formed at a distance from a spacer formed on a sidewall of the second gate electrode.

The first thickness of the first gate electrode and the third gate electrode and the second thickness of the second gate electrode may be identical to each other, isolation structures formed between the first, the second, and the third transistors may each have a trench structure, and depths of the trench structures may be identical to each other.

The gate voltage and the drain voltage that are applied to the second transistor may be half of the gate voltage and the drain voltage that are applied to the third transistor.

The gate voltage that is applied to the first transistor may be identical to the gate voltage that is applied to the third transistor, and the drain voltage that is applied to the first transistor may be half of the drain voltage that is applied to the third transistor.

The semiconductor device may include a digital analog converter (DAC), an amplifier (AMP), and an output driver, and the first transistor may be used for the digital analog converter, the second transistor may be used for the amplifier, and the third transistor may be used for the output driver.

The first source region, the first drain region, the second source region, the second drain region, the third source region, and the third drain region may be high-concentration regions.

In another general aspect, a semiconductor device includes a digital analog converter (DAC), an amplifier (AMP), and an output driver, wherein the digital analog converter includes a first gate insulator having a first thickness, a first source region and a first drain region, a pair of lightly doped drain (LDD) regions that are each shallower than the first source region and the first drain region, and a first gate electrode, the amplifier includes a second gate insulator having a second thickness, a second source region and a second drain region, a pair of drift regions that encompass the second source region and the second drain region respectively, and a second gate electrode, the output driver includes a third gate insulator having a third thickness, a third source region and a third drain region, a pair of drift regions that encompass the third source region and the third drain region respectively, and a third gate electrode.

The first thickness of the first gate insulator and the third thickness of the third gate insulator may be identical to each other, and the second thickness of the second gate insulator may be thinner than the thicknesses of the first and the third gate insulators.

The semiconductor device may further include a level shifter, wherein the level shifter includes a level shifter gate insulator and a level shifter gate electrode, a level shifter source region and a level shifter drain region, a level shifter well region of a first conductivity type that encompasses the level shifter source region, and a level shifter drift region of a second conductivity type that encompasses the level shifter drain region.

The level shifter gate insulator may form a thin gate insulator and a thick gate insulator in a stepped shape, the level shifter drift region may extend from the level shifter drain region to the thin gate insulator, and a depth of the level shifter well region with the first conductivity type may be deeper than a depth of the level shifter drift region with the second conductivity type.

The level shifter may be an Extended Drain Metal Oxide Semiconductor (EDMOS) transistor.

The semiconductor device may be a source driver IC.

The source driver IC may include output channels, and the output channel may include two channels opposite to each other.

The first source region, the first drain region, the second source region, the second drain region, the third source region, and the third drain region may be high-concentration regions.

Lengths of the first and the second gate electrodes may each be shorter than a length of the third gate electrode.

Other features and aspects will be apparent from the following detailed description, the drawings, and the claims.

BRIEF DESCRIPTION OF THE DRAWINGS

FIG. 8 is a cross-sectional view of an on-status low resistance high voltage transistor according to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
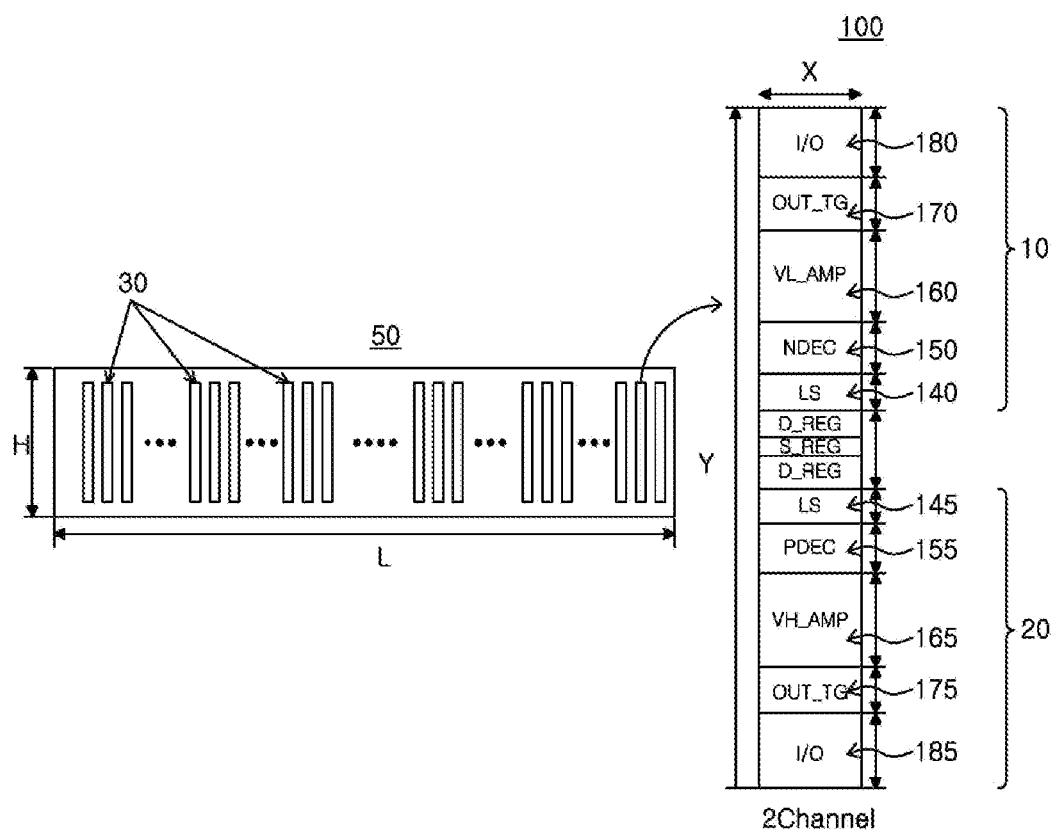
FIG. 1 is a diagram illustrating semiconductor device for a display driver IC according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

The examples are directed to providing a display driver IC structure that diminishes costs by reducing the chip size, such as by using transistors suitable for voltage, for instance, high voltage or half voltage, of each circuit instead of using a conventional high voltage transistor.

More particularly, a logic voltage is applied to a gate electrode of a level shifter of the display driver circuit. Therefore, the examples are directed to providing a display driver IC structure that reduces the circuit size by using an n-type Extended Drain Metal Oxide Semiconductor (nED-MOS) transistor suitable for the applied voltage.

Furthermore, half of a high voltage is applied to the drain/source electrode of the digital analog converter. Therefore, the examples are directed to providing a display driver IC structure that maintains the gate oxide thickness corresponding to the thickness of a high voltage transistor and reduces the circuit size by using a transistor made up of a junction structure of a low voltage transistor for the drain/source region.

Furthermore, half of high voltage is applied to the gate/drain source of the high voltage unity gain amplifier. Therefore, the examples are directed to providing a display driver IC structure that reduces the circuit size by using a Half HV transistor, the size of which is smaller than the conventional high voltage transistor due to being formed by the process of Triple Gate oxidation.

Further, the examples are directed to providing a display driver IC structure that reduces the circuit size by using a high voltage transistor with high performance. Such a high voltage transistor is improved in terms of the on-status resistance characteristic when compared to a conventional high voltage transistor.

Thus, the examples are directed to providing a display driver IC structure that guarantees the best efficiency and reduces the entire circuit size by using transistors suitable for each function circuit which employ the triple gate insulator fixation approach.

A digital source driver keeps digital signals entered from a memory IC in latches in sequential order, converts them into an analog voltage in a DAC, and conveys the digital signals to each data line. A digital source driver includes one or more of a high speed shift register, a latch, a DAC, a buffer amplifier, and so on.

FIG. 1 is a diagram illustrating a semiconductor device for a display driver IC according to an example. As illustrated in the example of FIG. 1, a display driver IC 50 has an L*H size, where L is length and H is height. For the purpose of driving a TV LCD display, hundreds or thousands of output channels 30, which are horizontally arranged in a row, are formed. The greater the number of output channels 30 there are, the larger the degree of definition the display has, because resolution increases. However, power consumption increases proportionately. For example, L is determined depending on the number of output channels 30. Thus, choosing an appropriate size of a unit output channel is highly relevant to the proper operation of the display driver IC 50.

As illustrated in the example of FIG. 1, each output channel 30 forms a channel configuration unit 100 made up of two channels 10 and 20. In the channel configuration unit 100, the width length, which is the Pitch or X value of each channel configuration unit 100 determines the length of the entire chip L by summing together. Because the channel configuration unit 100 is formed with hundreds and thousands of times of repetition, the smaller the size of an X direction of the channel configuration unit 100 is, and it is advantageous to achieving a greater net die. Accordingly, the width of unit channel is required to be small to secure a high net die. The examples provide a way to reduce the length of pitch X of the channel configuration unit 100. Also, the length of the Y axis of the channel becomes the height H of the driver IC.

When it is magnified, the block diagram of the channel configuration unit 100 includes two channel blocks 10, 20 that are arranged next to each other. Each semiconductor device is arranged symmetrically around the center. A first channel block 10 includes a level shifter (LS) 140, NDEC 150, VL_AMP 160, OUT_TG 170, and I/O 180.

A second channel block 20 includes a level shifter (LS) 145, PDEC 155, VL_AMP 165, OUT_TG 175, and output pad (I/O) 185.

Figure 2:
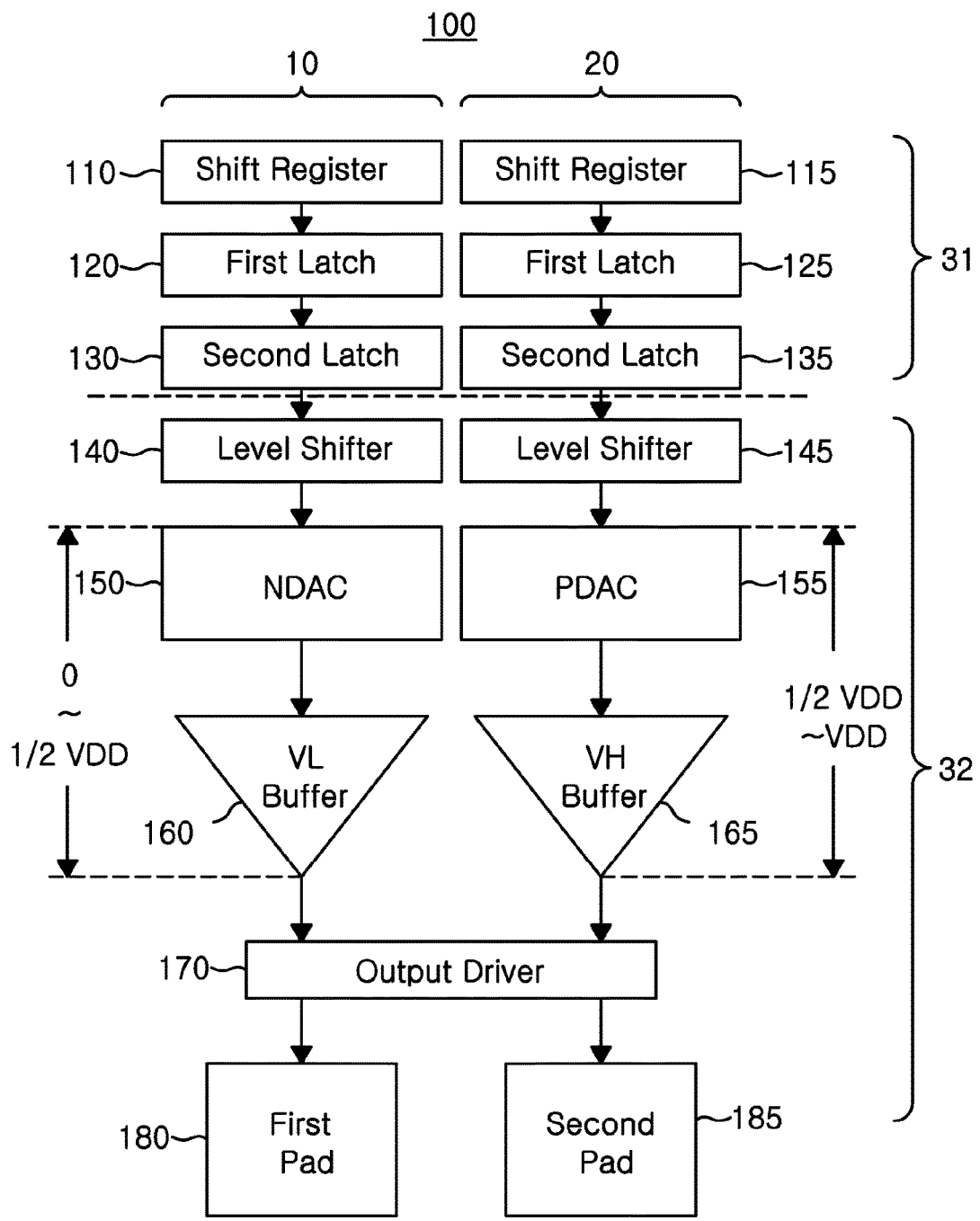
FIG. 2 is a diagram illustrating a channel configuration unit with two channels of a display driver IC according to an example.

With respect to the first channel block 10 and the second channel block 20, TG means a transmission gate. NDEC and PDEC mean a negative decoder and a positive decoder respectively. It is to be noted that the NDEC and PDEC are matched to the NDAC and PDAC, as illustrated in FIG. 2. Furthermore, VL_AMP 165 is also to be matched to a VL buffer or a VH buffer, as illustrated in FIG. 2. An OUT_TG 175 is matched to an output driver, as illustrated in FIG. 2.

FIG. 2 is a diagram illustrating a channel configuration unit 100 made up of two channels of display driver IC 50 according to an example.

The channel configuration unit 100 of a display driver IC 50 according to an example includes a first channel unit 10 and a second channel unit 20. In this example, even though the channel randomly shows two channels taken from the display driver IC 50, the unit two channel is formed in the display driver IC 50 by forming hundreds and thousands of channels by repetition on LCD driver device. For example, the first channel unit 10 includes a shift resistor 110, a first latch 120, a second latch 130, a level shifter 140, a first digital analog converter (NDAC) 150, a buffer 160, an output driver 170, and a first pad 180. The second channel unit 20 includes a shift resistor 115, a first latch 125, a second latch 135, a level shifter 145, a second digital analog converter (PDAC) 155, a buffer 160, an output driver 170, and a second pad 185.

In the example of FIG. 2, the shift registers 110, 115 function to manage shifting digital data synchronized in a clock signal. Accordingly, a shift register takes the role of generating pulse signals in sequential order using clock signal. The first latch to the fourth latch 120, 125, 130, 135 assume the role of storing digital data. The level shifters 140, 145 each convert a low voltage input signal to a high voltage input signal.

The first Digital-to-Analog Converter (DAC) and the second DAC 150, 155 convert digital input signals to analog signals. Furthermore, the digital analog converters 150, 155 are an NMOS digital analog converter (NDAC) 150 and a PMOS digital analog converter (PDAC) 155 according to the first channel with a value of 0 or ½ VDD and the second channel with a value of ½ VDD or VDD.

The VL and VH buffers 160, 165 are formed by connecting several inverters in series. The buffers increase charging speed by reducing the output resistance of a signal and by increasing a driving current. Accordingly, the buffers reduce signal delay. The VL and VH buffers 160, 165 consist of a Voltage Low (VL) buffer 160 and a Voltage High (VH) buffer 165 corresponding to channels 10, 20.

Accordingly, the channel configuration unit 100 is divided into two blocks 31, 32 according to voltage applied to gate or drain electrodes in the blocks 31, 32.

The first block is a low voltage block 31 and is manufactured by using a low voltage transistor. Therefore, a shift register 110, the first latches 120, 125, and the second latches 130, 135 all consist of low voltage transistors.

The second block is a high voltage block 32 and is manufactured by using a high voltage transistor. A high voltage ranging from 8V to 30V is applied to more than one terminal of the gate electrode or the drain electrode. Medium voltages or high voltages having values higher than the low voltage values are all considered to be high voltages. This approach is used because a driving voltage with a high voltage is required for large size screen output such as LCD, LED, UHD, AMOLED TVs, due to the power requirements of such screens. For instance, as 70% of a display driver IC 50, in an example, is made up of high voltage transistors, a high voltage transistor is an important part for determining the overall chip size.

The high voltage block 32 includes level shifters 140, 145, digital analog converters 150, 155, a VL and a VH amplifier 160, 165, and an output driver 170 and output pads 180, 185. Herein, the pads 180, 185 can be composed of a first pad or Odd Pad 180 and a second pad or Even Pad 185. The level shifters 140, 145, the digital analog converters 150, 155, the VL and VH buffer 160, 165, and the output drivers 170, 175 are manufactured by using high voltage transistors.

Figure 3:
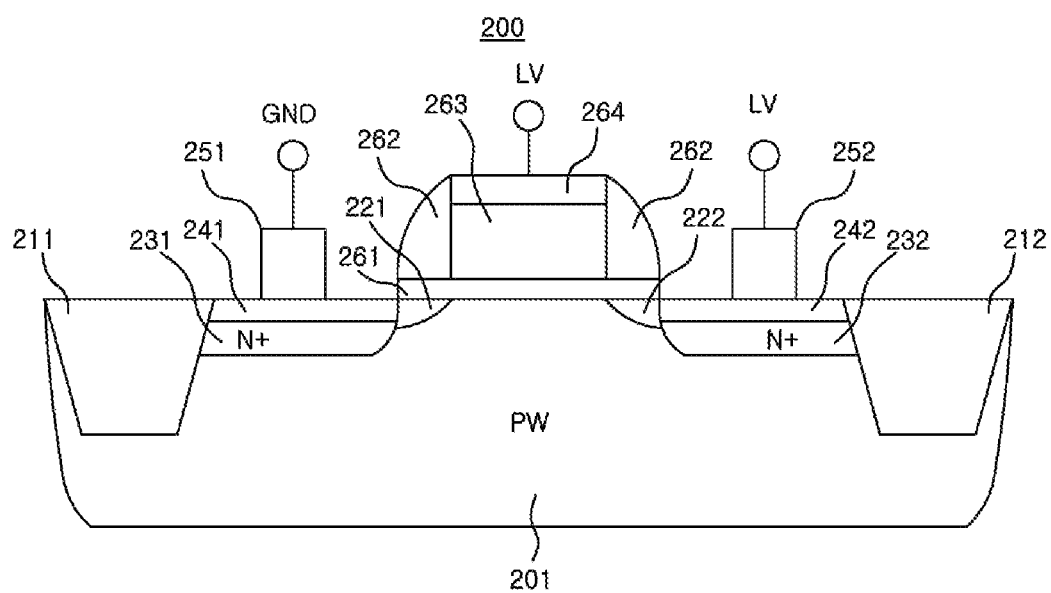
FIG. 3 is a cross-sectional view of a low voltage transistor which is used for a shift register, a first latch, and a second latch of the present disclosure.

FIG. 3 is a cross-sectional view of a low voltage transistor 200 used for the shift register 110, the first latches 120, 125, and the second latches 130, 135 of the present disclosure, such as in FIG. 2.

As illustrated in the example of FIG. 3, the low voltage transistor 200 is an N-channel transistor, and includes a well region of a P-type (PW) 201, isolation regions 211, 212, LDD regions of an N-type 221, 222, a source region of an N-type 231 and a drain region 232, silicide regions 241, 242, a source electrode 251, a drain electrode 252, a gate insulator 261, a spacer 262, a gate electrode of an N-type 263 and a silicide 264. A low voltage transistor 200 also comprises a P-channel transistor. A P-channel of an opposite channel forms conductivity in the opposite way with respect to the N-channel transistor that is explained above. An N-channel or a P-channel low voltage transistor 200 signifies that a low voltage below 5V is applied to the gate and the drain terminal of such a transistor. The thickness of the gate insulator 261 is formed to be very thin, with the thickness being less than 5 nm. PW 201 is formed to be deeper than the depth of the isolation regions 211, 212. For example, a Shallow Trench Isolation (STI) structure or a Middle Trench Isolation (MTI) structure is used depending on the requirements for the structure of the isolation regions 211, 212. In such an example, the depth structure of an STI is relatively shallow and the depth of it is between 0.3 um to 0.5 um. Such an STI structure is formed thinner compared to medium voltage isolation regions 511, 512, which will be mentioned hereafter.

Figure 4:
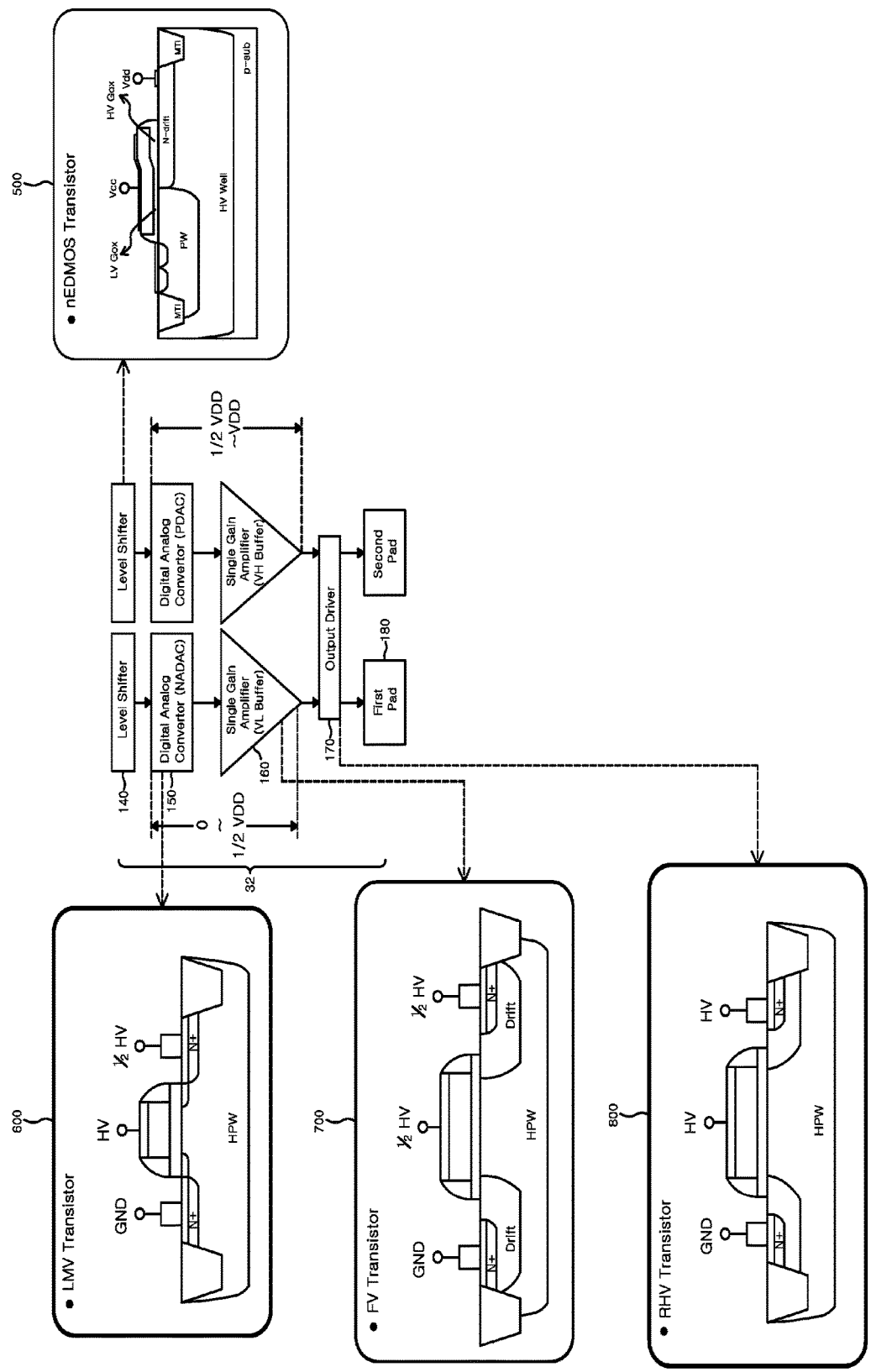
FIG. 4 is a cross-sectional view of a plurality of high voltage transistors which are used for a high voltage block of a display driver IC structure according to an example.

FIG. 4 is a diagram of a plurality of high voltage transistors used for a high voltage block 32 in a display driver IC structure 50 according to an example.

Each component of a multiplicity of high voltage transistors is described in more detail as follows.

First, for example, a level shifter 140 may consist of an Extended Drain Metal Oxide Semiconductor (EDMOS) transistor 500.

Second, for example, a digital analog converter 150 may consist of a logic medium voltage (Logic MV, LMV) transistor 600.

Third, for example, a single gain amplifier 160 may consist of a half voltage transistor or a FV transistor 700.

Fourth, for example, the output driver 170 may consist of an on-status low resistance high voltage (low Ron HV) transistor 800.

In such a manner, a high voltage block 32 potentially consists of at least one of the transistors chosen from among the EDMOS transistor 500, the logic medium voltage transistor 600, the half voltage transistor 700 and the on-status low resistance high voltage transistor 800.

Accordingly, a structure of display driver IC 50 according to an example is able to secure optimal performance by using circuits that are composed of transistors suitable for the voltages, for instance, high voltages or half voltages, that are used for each circuit. Also, the display driver IC 50 is able to secure more chips produced per one wafer by reducing the chip size.

Table 1 shows a specific composition of each element that is used for a low voltage block 31 and a high voltage block 32 of a display driver IC 50 structure according to an example.

TABLE 1

| Circuit Unit Demarcation | Element | Transistor Structure | Gate(G) and Drain (D) Approval Voltage | Low Doping Region | Gate Insulator Thickness(Gox) and Gate Length (Lg) |
|---|---|---|---|---|---|
| Low Voltage Block (LV Region) | Shifter Register, The First and The Second Latches | LV MOS | All LV | LDD | Gox < 5 nm |
| High Voltage Block (HV Region) | Level Shifter | EDMOS or LDMOS | G: LV D: HV | LDD and Drif | Gox: Below 5 nm and 30-70 nm. |
| | NDAC & PDAC | LMV MOS 1st TR.) | G: HV D: ½ HV | LDD | Gox: 30-70 nm (Identical to HV MOS) Lg(LMV) < Lg(HV) |
| | VL and VH Buffer (AMP) | FV MOS 2nd TR.) | All ½ HV | Drift | Gox: 10-30 nm Lg (FV) < Lg(HV) |
| | Output Driver | HV MOS 3rd. TR.) | All HV | Drift | Gox: 30-70 nm Lg(HV) > Lg(LMV, FV) |

Listed below are explanations of the structure and effects of a transistor used for a high voltage region of a display driver IC 50 according to an example. The explanations refer to the examples of FIGS. 5A to 8.

Figure 5A:
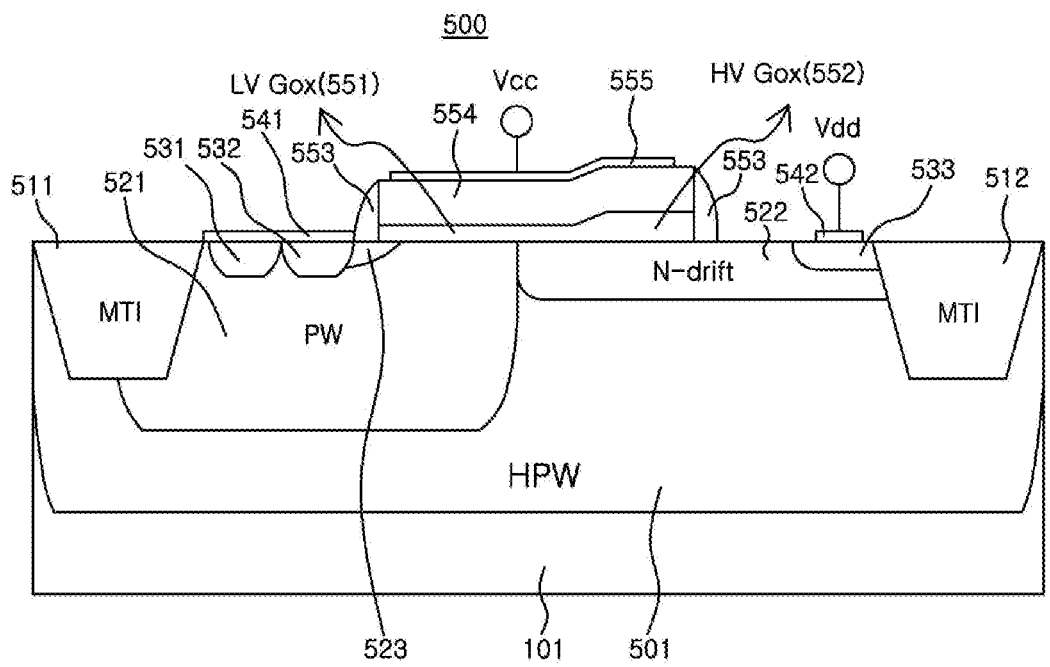
FIG. 5A, FIG. 5B, and FIG. 5C are diagrams illustrating a cross-sectional view and effects of a nEDMOS transistor according to an example.
Figure 5B:
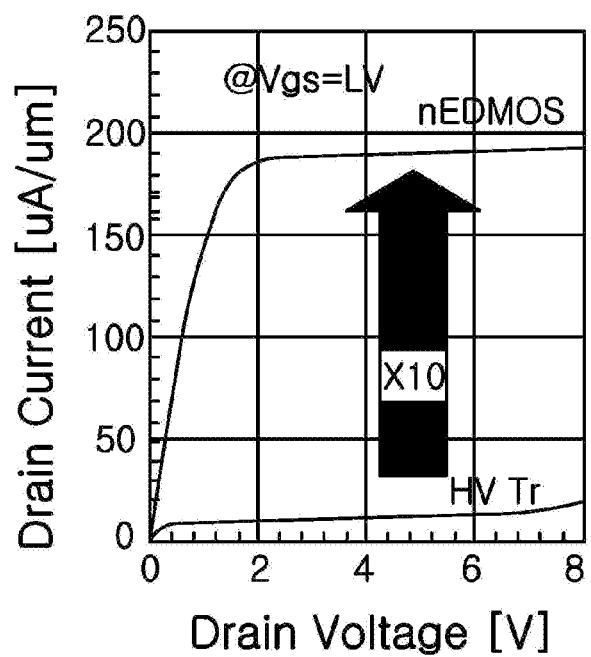
Figure 5C:
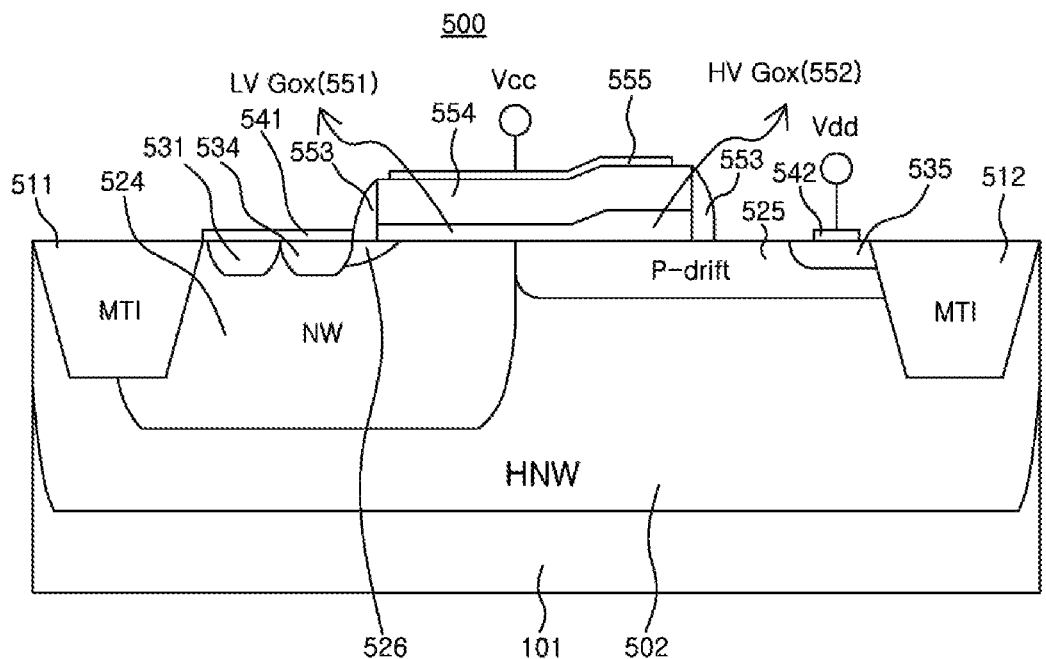

FIGS. 5A, 5B, and 5C are diagrams illustrating the cross-sectional views and effects of a nEDMOS transistor according to an example.

As illustrated in the example of FIG. 5A, a nEDMOS transistor 500 of channel N forms a high voltage p-type well region (HPW) 501 on a p-type substrate 101. Additionally, in the nEDMOS transistor 500, a first isolation region and a second isolation region are formed as well. To form a channel region, a P-logic well region (PW) 521 is formed inside an HPW region 501. N-type drift region 522, formed in contact with PW 521, is also included. The resistance is reduced and a high breakdown voltage is guaranteed by the presence of N-type drift region 522. Also, a high drain current is obtained. For this purpose, the N-type drift region 522 is required to be extended to a low voltage gate insulator 551.

P-type logic well region 521 is formed during the same step as a P-type well region 201 of a low voltage transistor. Thus, a new mask is not necessary to form these two well regions. In the example of the LDMOS device, a P-type body mask is occasionally used for forming the LDMOS device. However, such an example does not use a P-type body mask. Instead, a P-type well mask for the formation of a low voltage transistor is used. Additionally, for the formation of an N-type drift region, a separate mask process is also required. In such an approach, the depth of PW 521 is formed to be deeper than the depth of the N-type drift 522. Thus, a channel formed with a broader size is achieved. Furthermore, in such an example, the isolation regions 511, 512 are required to separate devices from each other. Likewise, the depth of PW 521 is deeper than the depth of N-type drift region 522. For example, the first and the second isolation regions 511, 512 formed for the purpose of separating devices are each formed as a middle trench isolation (MTI) structure. For example, the depth of the first and the second isolation regions 511, 512 is between 0.8 and 2 um. When the isolation regions of the low voltage transistors 211, 212 are formed in an STI structure, the MTI structure used for medium voltage transistor structure is formed to be deeper. However, when a MTI structure is used for an isolation region of low voltage TR, trench structures having the same depth are formed.

Also, a P-type high concentration pickup region 531 and an N-type high concentration source region 532 are formed inside the P-type logic well region (PW) 521. Additionally, a high concentration drain region 533 is formed inside N-type drift region 522. The silicide regions 541, 542 used for reducing resistance are formed on P-type high concentration pickup region 531, N-type high concentration source region 532 and high concentration drain region 533. Additionally, LV gate insulator 551, HV gate insulator 552, a spacer 553, gate electrode 554 and a silicide 555 are included between the N-type high density source region 532 and the high density drain region 533. A low voltage gate insulator 551 is formed around a source region 532, and a high voltage gate insulator is formed around a drain region 533. The low voltage gate insulator and high voltage gate insulators 551, 553 are each formed as a stepped gate oxide. For example, such insulators have variable thicknesses at different areas. The thickness of the low voltage gate insulator 551 is below 5 nm. Meanwhile, the thickness of the high voltage gate insulator 552 is between 30-70 nm. Also, an N-type LDD region 523 is formed under the space 553 that is formed around the source region 532. The LDD region 523 takes on the role of relieving the electric field. However, an LDD region is not formed under the spacer 553 around the drain region 533. Instead of an LDD region, an N-type drift region 522 is formed. Accordingly, the electric field is reduced in such an example, and the drain current increases accordingly. The structures such as Local Oxidation of Silicon (LOCOS) and STI do not exist between the gate electrode and the drain electrode and a thick gate insulation layer is formed. Thus, the surface of the substrate located between the source electrode and the drain electrode is not planar.

An N channel EDMOS transistor 500 supplies a high voltage of between 10V to 40V to a drain apparatus. However, the N channel EDMOS transistor 500 supplies a low voltage of between 0.5V to 5V to a gate terminal. A ground voltage is supplied to the source region. Thus, a level shifter 140 according to an example dramatically reduces the chip size in comparison to alternative by reducing the size of various design features through the use of an EDMOS transistor 500.

As illustrated in the example of FIG. 5B, the size of a circuit may be decreased as the current increases in the nEDMOS transistor 500. When operating with a drain voltage with the same drain current, a drain current that is more than ten times higher than an alternative high voltage transistor HV Tr flows in the nEDMOS transistor 500. Furthermore, the size of the nEDMOS transistor 500 may be decreased from 35% to 70% compared to an alternative high voltage transistor HV Tr.

FIG. 5C is a cross-sectional view of a pEDMOS transistor according to an example.

According to the example of FIG. 5C, a level shifter 140 includes a P channel EDMOS transistor. In the P channel, conductivity of elements is formed to be contrary to that of a counterpart N channel EDMOS transistor. For example, an N type high voltage well region (HNW) 502 is formed instead of an HPW. Also, an N type logic well region (NW) 524 is formed in the P type logic well region. A P type drift region 525 is formed in the n-type drift region. Finally, a P type high-concentration source and drain region (P+S/D) 534, 535 is formed instead of an N+S/D, also in the source/drain region.

Figure 6:
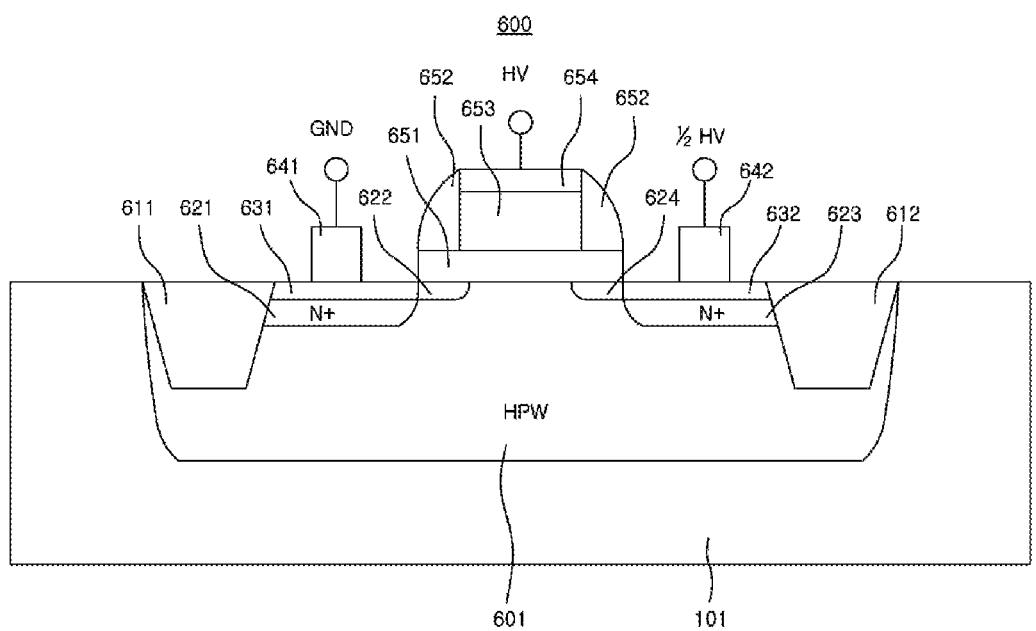
FIG. 6 is a diagram illustrating a cross-sectional view and effects of a logic medium voltage transistor used for a digital analog converter according to an example.

FIG. 6 is a cross-sectional view of a logic medium voltage transistor used for s Digital-Analog converter (DAC) according to an example.

As illustrated in the example of FIG. 6, a P type well region (HPW) 601 for high voltage and the first and second isolation regions 611, 612 are formed on the P type substrate 101 in a Logic Medium Voltage (LMV) Transistor 600 of an N-channel. In this example, the first and second isolation regions 611, 612 are formed for the separation between devices of the STI structure or the MTI structure. As an LDD region 622 is formed instead of a drift region, an STI structure with a relatively shallow depth is able to be used. In this example, the depth of an MTI structure is between 600-1000 nm according to the voltage supplied to the drain electrode 642. When the drain supplied voltage is around 18V, the depth is chosen to be around 700-1000 nm. However, when the drain supplied voltage is around 13.5V, depth is chosen to be around 600-900 nm. Also, when the drain supplied voltage is around 9V, the depth is chosen to be around 500-700 nm. When both STI/MTI structures are applied, such a configuration is called a dual trench and such a process is no more than one or two. Most of the Large Display Driver IC (LDDI) technology configurations preferentially use an MTI structure, and most of Mobile Display Driver IC (MDDI) technology configurations used for home appliance preferentially use an STI structure, the depth of which is chosen to be between 30 to 40 nm. This approach is used because STI is not really required to be formed, considering the dual trench process is difficult and a high voltage (HV) device takes up about 80 to 90% of the area in regard to LDDI technologies. On the contrary, an MTI is not required to be formed in case of MDDI technologies as a Low Voltage (LV) device such as an SRAM chip takes up more than 90% of the device size. Therefore, when the areas of LV structure such as SRAM and HV structure are similar to each other in Chip, in this situation, dual trench structure including both STI and MTI structures is used.

Also, one pair of n-type Lightly Doped Drain (LDD) regions 622, 624 is formed in HPW 601. N-type high-concentration doping source region 621 and a drain region 623 are formed in HPW 601. Furthermore, in the example of FIG. 6, silicide regions 631, 632, a source electrode 641, and a drain electrode 642 are formed on high-concentration doping areas 621, 623. Also, in such an example, a high voltage gate electrode 651, a spacer 652, a gate electrode 653, and a silicide 654 are formed between a source region 621 and a drain region 623. In this example, the source region 621 and the drain region 623 are formed to be aligned with respect to a spacer 652.

In the example of FIG. 6, a digital analog converter 150 is composed of a LMV transistor. A high voltage (HV) is supplied to a gate electrode 653 and a ½ high voltage (½ HV) is supplied to a drain electrode 642 in the digital analog converter 150.

Accordingly, in a digital analog converter 150, a gate electrode 653 is formed having a predetermined high voltage gate oxide thickness. Also, a high voltage gate insulator 651 is formed having a thickness of 30-70 nm. The high voltage gate insulator 651 is formed having the same thickness as the high voltage gate insulator 552 of the nEDMOS transistor 500. Because LDD structures 622, 624 are used for the lightly doped drain region, instead of an n-type drift region as in alternatives, the size of a unit LMV transistor 600 decreases by more than 40% as compared to that of the conventional HV Transistor. Because the size of the transistor that constructs the digital analog converter decreases as a result of using this approach, the size of the circuit is reduced accordingly. Therefore, because both the LDD regions 622, 624 and the drift region all have a low doping concentration, the roles of these elements are similar to each other. That is, the LDD regions 622, 624 and the drift region act to relieve the electric field of the high-concentration doping regions 621, 623. When the electric field is relieved in this manner, the breakdown voltage also increases. Thus, using the LDD structure in a low voltage or logic transistor helps control the hot carrier injection process. Therefore, as illustrated in the example of FIG. 6, the LDD regions 622, 624 are formed to be close to the high-concentration doping source/drain regions 621, 623 without encompassing the high-concentration doping regions 621, 623. Therefore, the depth of the LDD regions 622, 624 is far shallower than the depth of the drift region. However, a HV transistor generally incorporates a drift region that enfolds the high-concentration doping source/drain region. Such an approach is used to guarantee a high breakdown voltage. Accordingly, it is difficult to secure a high breakdown voltage using LDD regions.

Figure 7A:
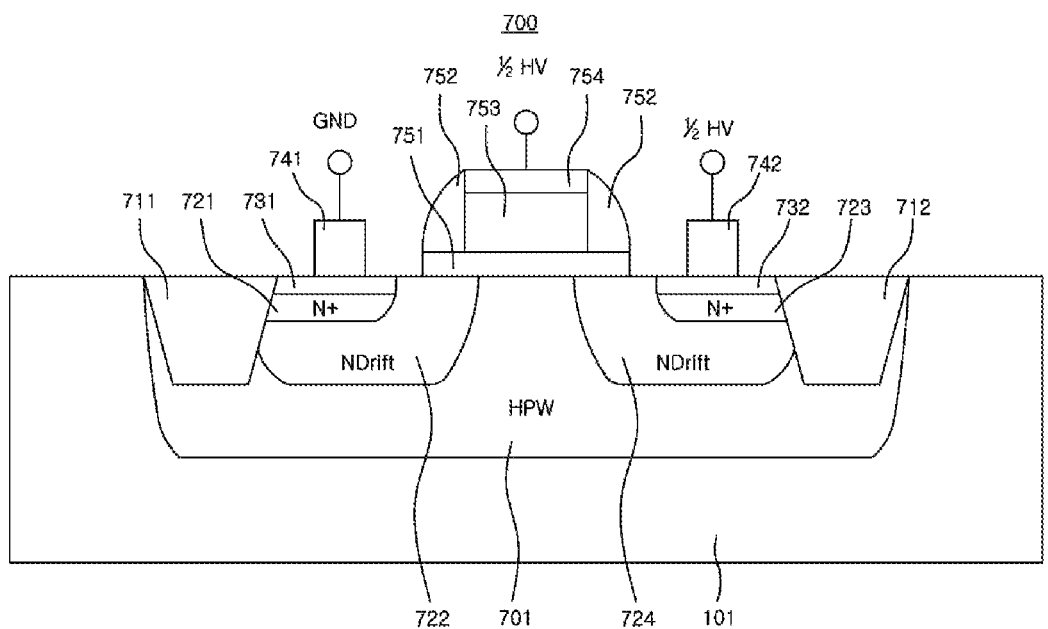
FIG. 7A, FIG. 7B, FIG. 7C, and FIG. 7D are diagrams illustrating a structure and effects of a half voltage transistor according to an example.
Figure 7B:
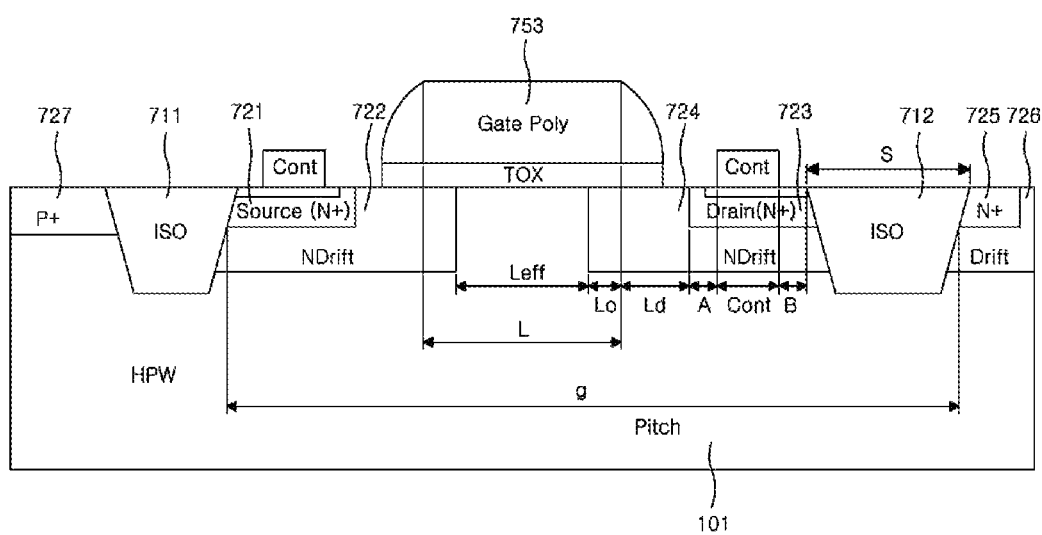
Figure 7C:
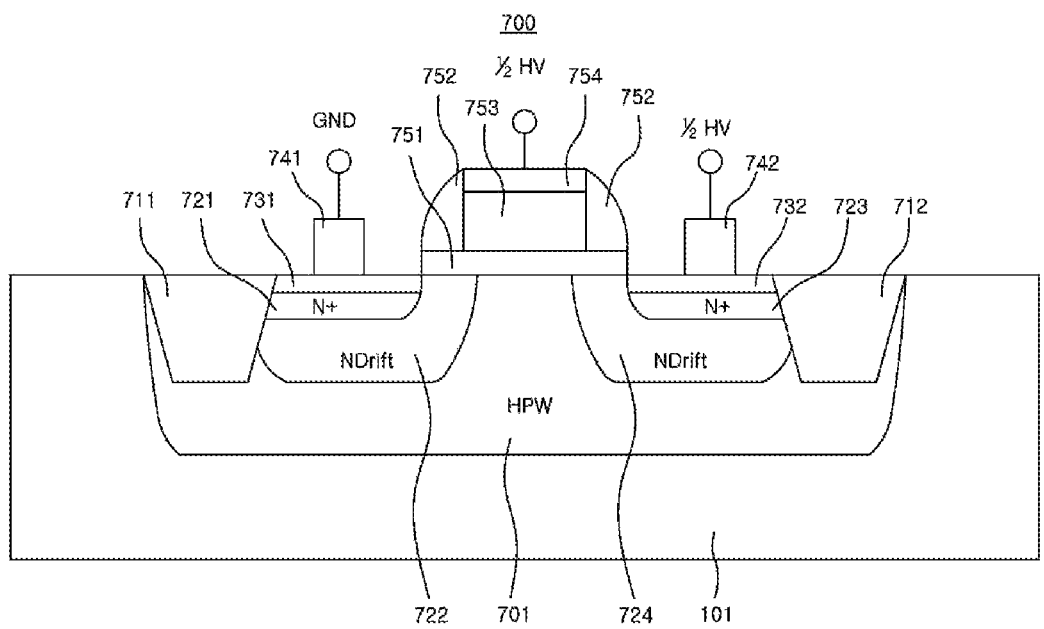

FIGS. 7A to 7C are diagrams illustrating structures and effects of a half voltage transistor according to an example.

As illustrated in the example of FIG. 7A, in a half voltage transistor or FV transistor 700, a high voltage p-type well region (HPW) 701, and the first and second isolation regions 711, 712 are formed on the P-type substrate 101. Also, a pair of low-concentration N-type drift regions 722, 724 is formed inside HPW 701. In other words, the N-type drift region includes the first drift region 722 and the second drift region 724. The N-type drift regions 722, 724 are formed during the same step that includes the formation of the drift region 522 of the nEDMOS transistor 500. Thus, the formation of the N-type drift regions 722, 724 is possible without the addition of another mask.

In the examples of FIGS. 7A-7C, an N-type high-concentration doping source region 721 and drain region 723 are respectively formed inside the first and the second drift regions 722, 724. Furthermore, silicide regions 731, 732 are formed on the high-concentration doping regions 721, 723. Additionally, a source electrode 741 and a drain electrode 742 are respectively formed on the silicide regions 731, 732.

In this example, a medium voltage gate insulator 751, a spacer 752, and a gate electrode 753, and a silicide 754 are formed between the source region 721 and the drain region 723.

The formation of the source region 721 and the drain region 723 occurs by aligning them in a spacer 752 and by ion injecting, with reference to the example of FIG. 6. However, in the structure illustrated in FIG. 7A according to an example, when the source region 721 and the drain region 723 are formed, these regions are not aligned in the spacer 752, and are instead formed by ion injecting at regular intervals. The breakdown voltage is increased by using this approach. For example, a high voltage single gain amplifier 160 according to an example consists of an FV transistor 700.

The high voltage single gain amplifier 160 consists of the transistor in which a ½ high voltage, namely, a half voltage, is supplied to the gate electrode 753 and the drain electrode 742.

Therefore, the high voltage single gain amplifier 160 consists of a half voltage transistor 700 in which the thickness of the medium voltage gate insulator 751 is reduced according to the predetermined ratio. For instance, the thickness is reduced by ½ compared to the thickness of high voltage and accordingly a half voltage is supplied to the drain electrode 742.

A half voltage ½ HV compared to the voltage supplied to the HV transistor 800 is supplied to the gate electrode 753 of the FV transistor 700. For instance, when 20V is supplied to the gate electrode 853 of the HV transistor 800 in FIG. 8, 10V, which is equal to 20V/2, is supplied to the gate electrode 753 of the FV transistor 700. Therefore, the thickness of the medium voltage gate insulator 751 of the FV transistor 700 can be 15-35 nm instead of 30-70 nm, or half of the corresponding thickness. Thus, because a ½ high voltage, namely, a half voltage ½ HV is supplied to the drain electrode 742, a small transistor with an accordingly small design requirements is used. As the drain voltage is reduced by half reduced, the design results are reduced accordingly.

FIG. 7B is a diagram illustrating a design approach according to an example. Such a design approach uses almost the same structure as the previously explained structure in the example of FIG. 7A. Only a P-type high-concentration contact region 727 used to supply ground voltage for HPW 701 is added in addition to the MTI structure. Furthermore, the N-type third high-concentration doping region 725 and the N-type third drift region 726 are separately formed from the drain region 723 and the drift region 724. Also, in this example, the other second FV transistor is located besides the FV transistor 700.

As discussed above, the pitch size and the source-drain current (IDsat) are important for the high voltage transistor structure used for the display driver IC 50. For example, as illustrated in the example of FIG. 7B, the pitch size is a distance from the left end of the source region 721, located besides the first isolation region 711 to the right end of the second isolation region 712. The pitch size is described as g=Leff+2(Lo+Ld+A+Cont+B)+S. In this equation, Leff is a distance between the first drift region 722 and the second drift region 724. Ld is a distance between a one side of the gate electrode 753 and a drain region 723. S is a width length of the isolation region. Lo is an overlap length of the drift region and the gate electrode. A is a distance from the left end of the drain region to the left end of the drain electrode. Cont is a length of the drain electrode. B is a distance from the right end of the drain electrode to the left end of the second isolation region. Accordingly, combining these distances based on the formula presented above results in a measurement of the pitch size.

The high voltage transistor structure used for the display driver IC 50 guarantees the competitiveness of the net die per one wafer when the pitch size is small and the source-drain current (IDsat) is high. In particular, to maintain a minimum breakdown voltage necessary for IC operation and for Shrink, which is the size corresponding to the effective gate length (Leff) and the gate-to-drain length (Ld), as illustrated in FIG. 7B, is important.

In the present disclosure, the FV transistor 700 further reduces Leff and Ld as compared to a high voltage transistor. Therefore, the pitch size in the length direction is potentially decreased about 10-40%. For instance, if the pitch size of the HV transistor is 10 um, the pitch size of the FV transistor 700 is potentially decreased to 6-9 um. As the pitch size decreases, the current value of the source-drain (IDsat) of the FV transistor 700 correspondingly increases. This effect applies not only for the NMOS FV transistor, but also for the PMOS FV transistor.

FIG. 7C is a cross-sectional view of a half voltage transistor according to an example. FIG. 7C is similar to the structure of FIG. 7A. The high-concentration source region 721 and the drain region 723 are aligned within the spacer 752 and are formed by ion injection. The rest of the diagram is identical to the FIG. 7A. Compared to the example of FIG. 7A, the chip size in the example of FIG. 7C may be decreased further because the source and the drain regions 721, 723 are formed as being aligned in the spacer 752. In this example, the breakdown voltage suffers a loss. This effect occurs because the breakdown voltage increases as the high-concentration source 721 and drain region 723 recede from the gate sidewall.

Figure 7D:
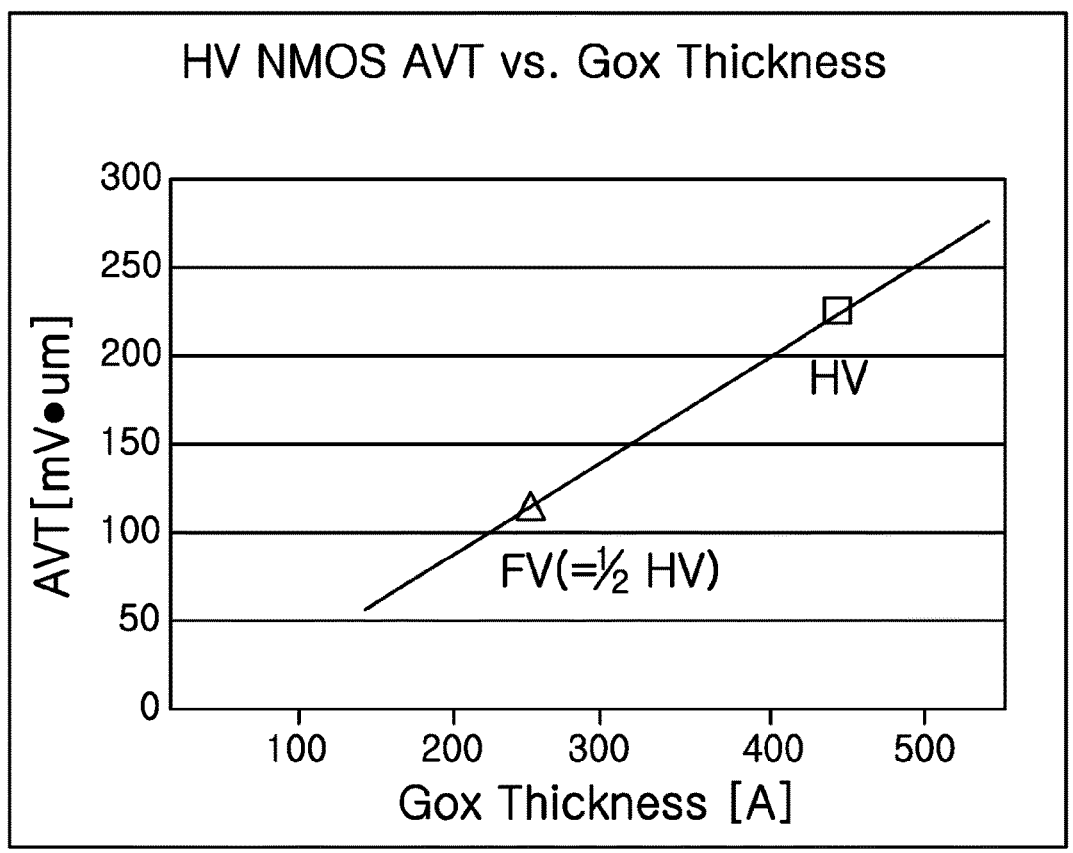

Accordingly, as illustrated in the example of FIG. 7D, the mismatching characteristic of a transistor and the AVT value is potentially improved by the reduction of the design approach, the current increase, and the reduction of the thickness of the medium voltage gate insulator 751. Furthermore, the offset characteristic of the high voltage single gain amplifier 160 is also potentially improved.

Accordingly, the high voltage single gain amplifier 160 according to an example provides a smaller circuit by using an improved half voltage transistor 700.

FIG. 8 is a cross-sectional view of an on-status low resistance high voltage transistor according to an example.

As illustrated in the example of FIG. 8, the high voltage transistor 800 includes a P-type high voltage well region (HPW) 801 formed on the P-type substrate 101 and first and the second isolation regions 811, 812. N-type first and second low-concentration drift regions 823, 824 are formed as shown inside HPW 801.

Furthermore, an N-type high-concentration doping source region 821 and a drain region 822 that are respectively formed in the first and in the second low-concentration drift regions 823, 824 are included. Silicide regions 831, 832, a source electrode 841, and a drain electrode 842 formed on the source region 821 and the drain region 822 are included as well.

The example of FIG. 8 also includes a high voltage gate insulator 851 formed between the source region 821 and the drain region 822, a spacer 852, a gate electrode 853, and a silicide 854. The source/drain regions 821, 822 are not aligned in the spacer 852 of the gate electrode 853 but are instead formed at regular intervals in a high voltage transistor 800. In this manner, the structure of the example of FIG. 8 is similar to the structure of the example of FIG. 7A.

However, the thickness of the gate insulator is formed to have a thickness of between 30-70 nm because a voltage ranging from 10 to 30 V is supplied. In case of the FV transistor, a half voltage compared to the HV transistor is supplied to the gate electrode. For instance, when 20V is supplied to the gate electrode of the HV transistor, 10V is supplied to the gate electrode of the FV transistor. Therefore, the thickness of the gate insulator of the FV transistor is 15-35 nm instead of 30-70 nm due to the correspondingly lower voltage.

The output driver according to the example 170 consists of a high-voltage transistor 800. The output driver 170 is characterized by the fast slew rate. Such a fast slew rate refers to the maximum rate at which an amplifier can respond to an abrupt change of input level. The output driver 170 consists of a transistor which supplies high voltage to the gate electrode 853 and the drain electrode 842.

Figure 9:
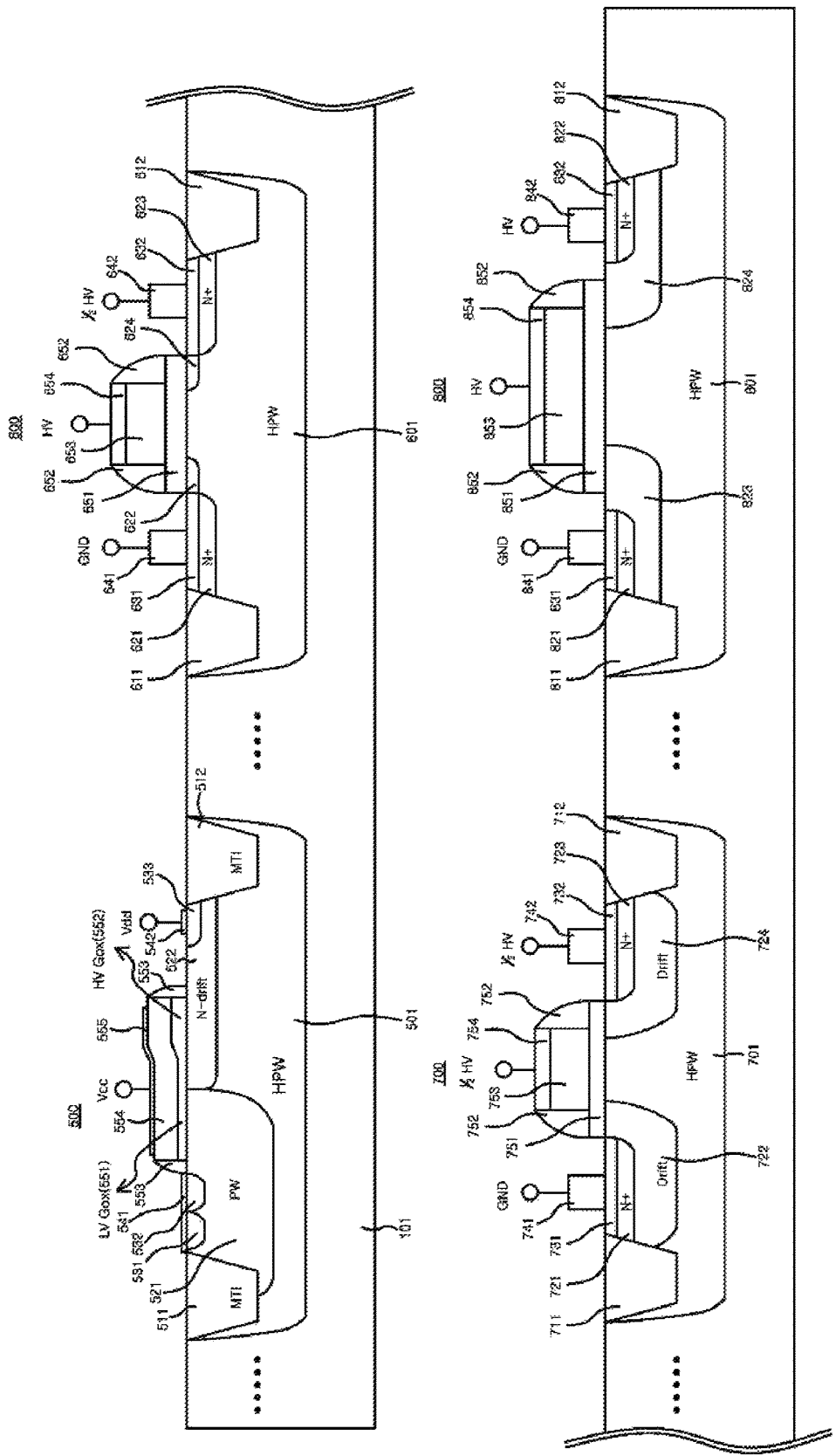
FIG. 9 is a cross-sectional view of a multiplicity of a high voltage transistor used for a high voltage block according to an example.

FIG. 9 is a cross-sectional view of a plurality of high voltage transistors used for a high voltage block according to an example. More specifically, the example of FIG. 9 is a diagram of an nEDMOS transistor 500, a logic medium voltage transistor 600, a half voltage transistor 700, and a high voltage transistor 800 manufactured in the one substrate 101.

The first, second, third, and fourth high voltage well regions 501, 601, 701, 801 are respectively formed on the P-type substrate 101. The first, second, third, and fourth high voltage well regions 501, 601, 701, 801 are all formed during the same step, under the same conditions, by ion injection at the same time. The second, third, and the fourth high voltage well regions 601, 701, 801 are additionally used as a channel region.

And a plurality of isolation regions 511, 512, 611, 612, 711, 712, 811, 812 are formed to separate each device from each other. And to relieve electric field, a plurality of low-concentration N-type drift regions 522, 722, 724, 823, 824 are formed. A low-concentration N-type drift region 522 of the nEDMOS is formed at the same time at which the N-type drift regions of a high voltage transistor 722, 724, 823, 824 are formed.

Furthermore, a P-type logic well region 521 is formed to form a channel of the nEDMOS device. The P-type well region 201 of the logic transistor is formed during the same step.

Additionally, in the example of FIG. 9, a plurality of gate insulators 551, 651, 751, 851 are formed. The plurality of gate insulators include the low voltage gate insulator 551, the medium voltage gate insulator 751, and the high voltage gate insulators 651, 851. The thickness of the gate insulators increases in the order of the low voltage gate insulator 551, the medium voltage gate insulator 751, and the high voltage gate insulators 651, 851. This relationship corresponds to the requirement for greater thickness when managing a greater voltage. The three gate insulators with different thicknesses are formed together on one substrate 101.

Thus, the example manufactures a smaller circuit compared to the conventional alternative products by manufacturing various devices forming a high voltage block 32 through using a triple gate insulator process.

In this example, a plurality of gate electrodes 554, 653, 753, 853 are formed. The plurality of gate electrodes includes the low voltage gate electrode 554, the medium voltage gate electrode 753, and the high voltage gate electrodes 653, 853. The low voltage/medium voltage/high voltage gate electrodes 554, 653, 753, 853 are all formed during the same step with the same thickness. Only the voltage supplied to each gate electrode is different, between the gate electrodes.

Additionally, a plurality of lightly doped drain (LDD) regions 221, 222, 622, 624 are produced to form a low voltage transistor 200 and a logic-medium voltage transistor 600. After a spacer is formed, the high-concentration doping pickup region 531, the plurality of high-concentration doping source regions 532, 621, 721, 821, and the drain regions 533, 623, 723, 822 are formed inside the high voltage well region (HPW). Subsequently, a silicide is formed on the substrate and the gate electrode.

In the high voltage block 32, the trench depths of the isolation regions are identical to each other and the thicknesses of the gate electrodes are all identical. However, trench structures with differing depths according to the width ratio of the low voltage region and the high voltage region may be formed on the low voltage block 31 and on the high voltage block 32.

The high voltage block 32 can be composed of two or more of the nEDMOS transistor 500, the logic medium voltage transistor 600, the half voltage transistor 700 and the high voltage transistor 800.

To summarize, the display driver IC 50 is formed by the integration of various semiconductor devices on the one substrate. For instance, the display driver IC 50 may include the first transistor 600, the second transistor 700, and the third transistor 800. The logic medium voltage transistor 600, the half voltage transistor 700 and the high voltage transistor 800 are respectively referred to as the first transistor 600, the second transistor 700, and the third transistor 800 in such an example.

In the example of FIG. 9, the first transistor 600 includes the first gate insulator 651 having the first thickness, the high-concentration first source region 621, the drain region 623, a pair of LDD regions 622, 624 having a shallower depth than the first source 621 and drain doping regions 623, and the first gate electrode 653.

The second transistor 700 includes the second gate insulator 751 having the shallower second thickness than the first thickness of the first transistor 600, the high-concentration second source and drain regions 721, 723, a pair of drift regions 722, 724 that respectively enfold the first source region and the drain region 721, 723, and the second gate electrode 753.

The third transistor 800 includes the third gate insulator 851 having the same thickness as the first thickness of the first transistor 600, the high-concentration third source and drain regions 821, 822, a pair of drift regions 823, 824 that respectively enfold the third source and drain regions 821, 822, and the third gate electrode 853. The lengths of the first and the second gate electrodes 653, 753 are shorter than the length of the third gate electrode 853.

The second source and drain regions 721, 723 of the second and the third transistors 700, 800 are formed at a regular distance from the spacer 752 formed on the sidewall of the second gate electrode 753. Also, the thicknesses of the first, second, and the third gate electrodes 653, 753, 853 are identical to each other. The plurality of separation structures formed between the first, the second, and the third transistors 600, 700, 800 have trench structures, and the depths of these trenches are all identical.

The gate voltage and the drain voltage supplied to the second transistor 700 is half of the gate voltage and the drain voltage supplied to the third transistor 800. The gate voltage supplied to the first transistor 600 is identical to the voltage supplied to the third transistor 800, and the drain voltage supplied to the first transistor 600 is half of the drain voltage supplied to the third transistor.

In the example of FIG. 9, the display driver IC 50 further includes an EDMOS or LDMOS transistor situated on the substrate. The EDMOS or LDMOS transistor includes the gate insulators 551, 552, the gate electrode 554, the EDMOS high-concentration source region and the drain region 532, 533, the well region 521 that has the first conductivity type that enfolds the EDMOS high-concentration source region, and the drift region 522 with the second conductivity that enfolds the EDMOS high-concentration drain region. In the example of FIG. 9, in the gate insulator, a shallow gate insulator 551 and the thick gate insulator 552 are formed to have a stepped form.

The drift region 522 has a structure that expands from the drain region 533 to the shallow gate insulator 551. Furthermore, the depth of the well region 521 having the first conductivity type (P type) is deeper than the depth of the drift region 522 having the second conductivity (N type).

The structure of the display driver IC 50 includes a level shifter, a digital analog converter (DAC), an amplifier (AMP), and an output driver. The EDMOS transistor is used as the level shifter, the first transistor 600 is used as the digital analog converter (DAC), the second transistor 700 is used as the amplifier, and the third transistor 800 is used as the output driver.

The driver IC structure having the transistor structure according to the present disclosure may also be used in conjunction with an emissive device, LED display driver IC structure or for a driving circuit IC for AMOLED display, and not just for a non-emissive device. Also, the DC-DC converter used for the operation of the OLED may also respectively manufactured for a source driver or a gate driver.

Hence, the examples reduce the circuit size by using a nEDMOS Extended Drain Metal Oxide Semiconductor (EDMOS), such as an nEDMOS, transistor suitable for the applied voltage.

Furthermore, the examples reduce the circuit size by maintaining the Gate Oxide thickness corresponding to the thickness of a high voltage transistor and by using a transistor with a Junction structure in the drain and source part of the transistor.

Further, the examples reduce the circuit size by using a Half HV transistor as a component, the size of which is relatively smaller as compared to the conventional, alternative high voltage transistor due to the use of the Triple Gate oxidation process in examples.

Further, the examples reduce the circuit size by using a high efficiency high voltage transistor having an improved on-status resistance.

In this manner, the examples reduce the entire chip size by manufacturing transistors suitable for each functional circuit.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a first transistor, a second transistor, and a third transistor formed on a semiconductor substrate, wherein
the first transistor comprises
a first gate insulator having a first thickness,
a first source region and a first drain region,
a pair of lightly doped drain (LDD) regions that are each shallower than the first source region and the first drain region, and
a first gate electrode,
the second transistor comprises
a second gate insulator having a second thickness that is thinner than the first thickness,
a second source region and a second drain region,
a pair of drift regions that encompass the second source region and the second drain region respectively, and
a second gate electrode, and
the third transistor comprises
a third gate insulator having the first thickness,
a third source region and a third drain region, and
a pair of drift regions that encompass the third source region and the third drain region respectively, and
a third gate electrode.

2. The semiconductor device of claim 1,
wherein lengths of the first and the second gate electrodes are each shorter than a length of the third gate electrode.

3. The semiconductor device of claim 1, further comprising,
an Extended Drain Metal Oxide Semiconductor (EDMOS) transistor located on the semiconductor substrate, wherein
the EDMOS transistor comprises
an EDMOS gate insulator and an EDMOS gate electrode,
an EDMOS source region and an EDMOS drain region,
an EDMOS well region of a first conductivity type that encompasses the EDMOS source region, and
an EDMOS drift region of a second conductivity type that encompasses the EDMOS drain region.

4. The semiconductor device of claim 3, wherein
the EDMOS gate insulator forms a thin gate insulator and a thick gate insulator in a stepped shape, and
the EDMOS drift region extends from the EDMOS drain region to the thin gate insulator.

5. The semiconductor device of claim 3, wherein
a depth of the EDMOS well region of the first conductivity type is deeper than a depth of the EDMOS drift region of the second conductivity type.

6. The semiconductor device of claim 1, wherein
the second source and second drain region of the second transistor are formed at a distance from a spacer formed on a sidewall of the second gate electrode.

7. The semiconductor device of claim 1, wherein
the first thickness of the first gate electrode and the third gate electrode and the second thickness of the second gate electrode are identical to each other, isolation structures formed between the first, the second, and the third transistors each have a trench structure, and the depths of the trench structures are identical to each other.

8. The semiconductor device of claim 1, wherein
a gate voltage and a drain voltage that are applied to the second transistor are half of a gate voltage and a drain voltage that are applied to the third transistor.

9. The semiconductor device of claim 1, wherein
a gate voltage that is applied to the first transistor is identical to a gate voltage that is applied to the third transistor, and a drain voltage that is applied to the first transistor is half of a drain voltage that is applied to the third transistor.

10. The semiconductor device of claim 1, wherein
the semiconductor device comprises a digital analog converter (DAC), an amplifier (AMP), and an output driver, and the first transistor is used for the digital analog converter, the second transistor is used for the amplifier, and the third transistor is used for the output driver.

11. The semiconductor device of claim 1, wherein the first source region, the first drain region, the second source region, the second drain region, the third source region, and the third drain region are high-concentration regions.

12. A semiconductor device, comprising:
a digital analog converter (DAC);
an amplifier (AMP); and
an output driver,
wherein the digital analog converter comprises
 a first gate insulator having a first thickness,
 a first source region and a first drain region,
 a pair of lightly doped drain (LDD) regions that are each shallower than the first source region and the first drain region, and
a first gate electrode,
the amplifier comprises
 a second gate insulator having a second thickness,
 a second source region and a second drain region,
 a pair of drift regions that encompass the second source region and the second drain region respectively, and
a second gate electrode,
the output driver comprises
 a third gate insulator having a third thickness,
 a third source region and a third drain region,
 a pair of drift region that encompass the third source region and the third drain region respectively, and
a third gate electrode.

13. The semiconductor device of claim 12, wherein
the first thickness of the first gate insulator and the third thickness of the third gate insulator are identical to each other, and the second thickness of the second gate insulator is thinner than the first thickness of the first gate insulator and the third thickness of the third gate insulator.

14. The semiconductor device of claim 12, further comprising,
a level shifter, wherein
the level shifter comprises
 a level shifter gate insulator and a level shifter gate electrode,
 a level shifter source region and a level shifter drain region,
 a level shifter well region of a first conductivity type that encompasses the level shifter source region, and
 a level shifter drift region of a second conductivity type that encompasses the level shifter drain region.

15. The semiconductor device of claim 14, wherein
the level shifter gate insulator forms a thin gate insulator and a thick gate insulator in a stepped shape,
the level shifter drift region extends from the level shifter drain region to the thin gate insulator,
and a depth of the level shifter well region with the first conductivity type is deeper than a depth of the level shifter drift region with the second conductivity type.

16. The semiconductor device of claim 14, wherein the level shifter is an Extended Drain Metal Oxide Semiconductor (EDMOS) transistor.

17. The semiconductor device of claim 12, wherein
the semiconductor device is a source driver IC.

18. The semiconductor device of claim 17, wherein
the source driver IC comprises output channels, and the output channel comprises two channels opposite to each other.

19. The semiconductor device of claim 12, wherein the first source region, the first drain region, the second source region, the second drain region, the third source region, and the third drain region are high-concentration regions.

20. The semiconductor device of claim 12, wherein lengths of the first and the second gate electrodes are each shorter than a length of the third gate electrode.

* * * * *